US012765248B2

(12) United States Patent
Kim et al.

(10) Patent No.: US 12,765,248 B2
(45) Date of Patent: Oct. 13, 2026

(54) DISPLAY DEVICE

(71) Applicant: Samsung Display Co., LTD., Yongin-si (KR)

(72) Inventors: Sunghwan Kim, Yongin-si (KR); Daehyun Kim, Yongin-si (KR); Jung Hoon Shim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 567 days.

(21) Appl. No.: 18/217,071

(22) Filed: Jun. 30, 2023

(65) Prior Publication Data

US 2024/0138244 A1 Apr. 25, 2024
US 2024/0237502 A9 Jul. 11, 2024

(30) Foreign Application Priority Data

Oct. 19, 2022 (KR) ........................ 10-2022-0135280

(51) Int. Cl.
*H10K 59/88* (2023.01)
*G09G 3/3233* (2016.01)
(Continued)

(52) U.S. Cl.
CPC ........... *H10K 59/88* (2023.02); *G09G 3/3233* (2013.01); *H10K 59/131* (2023.02);
(Continued)

(58) Field of Classification Search
CPC .. H10K 59/88; H10K 59/131; H10K 59/1213; H10K 59/123; H10K 71/861;
(Continued)

(56) References Cited

U.S. PATENT DOCUMENTS

2015/0262526 A1* 9/2015 Park ..................... G09G 3/3233 345/76
2020/0410935 A1* 12/2020 Kim ..................... G09G 3/3233
(Continued)

FOREIGN PATENT DOCUMENTS

CN 114467134 A 5/2022
KR 1020070050541 A 5/2007
(Continued)

OTHER PUBLICATIONS

Office Action dated Jan. 30, 2026 from the Korean Intellectual Property Office (KIPO) for Korean Patent Application No. 10-2022-0135280, 16 pages.

*Primary Examiner* — Douglas Wilson
(74) *Attorney, Agent, or Firm* — CANTOR COLBURN LLP

(57) ABSTRACT

A display device includes a substrate including an active area and a dummy area, and including a plurality of sub-pixels arranged in m rows and n columns, first initialization power lines which provide a first initialization voltage to sub-pixels of the plurality of sub-pixels and extending in a column direction, second initialization power lines which provide a second initialization voltage to sub-pixels of the plurality of sub-pixels and extending in the column direction, and repair lines extending in a row direction. Sub-pixels of the dummy area are arranged in an outermost column of the n columns, the repair lines are arranged so as to connect the sub-pixels of the dummy area and sub-pixels of the active area among the plurality of sub-pixels, respectively, and m and n are natural numbers.

17 Claims, 8 Drawing Sheets

(51) Int. Cl.

| | |
|---|---|
| ***H10K 59/121*** | (2023.01) |
| ***H10K 59/131*** | (2023.01) |
| ***H10K 71/00*** | (2023.01) |

(52) U.S. Cl.

CPC ............... *G09G 2300/0413* (2013.01); *G09G 2300/0452* (2013.01); *G09G 2300/0819* (2013.01); *G09G 2300/0842* (2013.01); *G09G 2300/0861* (2013.01); *G09G 2310/0262* (2013.01); *G09G 2330/08* (2013.01); *G09G 2330/10* (2013.01); *H10K 59/1213* (2023.02); *H10K 71/861* (2023.02)

(58) Field of Classification Search

CPC ......... G09G 3/3233; G09G 2300/0413; G09G 2300/0819; G09G 2300/0842; G09G 2300/0861; G09G 2300/0452; G09G 2310/0262; G09G 2330/08; G09G 2330/10

See application file for complete search history.

(56) References Cited

U.S. PATENT DOCUMENTS

| | | | | |
|---|---|---|---|---|
| 2021/0391407 | A1 | 12/2021 | Yoon et al. | |
| 2022/0320196 | A1* | 10/2022 | He | H10K 59/1216 |
| 2022/0367597 | A1* | 11/2022 | Nishiyama | H10K 59/1216 |
| 2026/0052857 | A1* | 2/2026 | Liu | H10K 59/1216 |

FOREIGN PATENT DOCUMENTS

| | | | | |
|---|---|---|---|---|
| KR | 20150107018 | A | 9/2015 | |
| KR | 1020180006543 | A | 1/2018 | |
| KR | 1020190030266 | A | 3/2019 | |
| KR | 20190077151 | A | 7/2019 | |
| KR | 102152950 | B1 | 9/2020 | |
| KR | 102163034 | B1 | 10/2020 | |
| KR | 1020200131392 | A | 11/2020 | |
| KR | 20210154301 | A | 12/2021 | |
| KR | 20220161832 | A * | 12/2022 | H01L 27/3218 |
| KR | 1020230000531 | A | 1/2023 | |

* cited by examiner

DISPLAY DEVICE

This application claims priority to Korean Patent Application No. 10-2022-0135280, filed on Oct. 19, 2022, and all the benefits accruing therefrom under 35 U.S.C. § 119, the content of which in its entirety is herein incorporated by reference.

BACKGROUND

1. Field

Embodiments relate to a display device.

2. Description of the Related Art

As information technology develops, an importance of a display device, which is a connection medium between a user and information, is emerging. As a result, the use of display devices such as liquid crystal display devices, organic light-emitting display devices, and plasma display devices is increasing.

Defective pixel may occur during the manufacturing process of the display device. The defective pixel may be displayed as a bright point that always emits light or a dark point that does not always emit regardless of the scan signal and the data signal. A method for increasing a yield of the display device by repairing such a defective pixel is desired.

SUMMARY

Embodiments provide a display device with improved display quality.

A display device in an embodiment includes a substrate including an active area and a dummy area, and including a plurality of sub-pixels arranged in m rows and n columns, first initialization power lines which provide a first initialization voltage to sub-pixels of the plurality of sub-pixels and extending in a column direction, second initialization power lines which provide a second initialization voltage to sub-pixels of the plurality of sub-pixels and extending in the column direction, and repair lines extending in a row direction. Sub-pixels of the dummy area among the plurality of sub-pixels are arranged in an outermost column of the n columns, the repair lines are arranged so as to connect the sub-pixels of the dummy area and sub-pixels of the active area among the plurality of sub-pixels, respectively, and m and n are natural numbers.

In an embodiment, the sub-pixels of the dummy area may be arranged in n column.

In an embodiment, the first initialization power lines and the second initialization power lines may be alternately disposed.

In an embodiment, the first initialization power lines may be disposed in sub-pixels of even columns among the plurality of sub-pixels.

In an embodiment, the display device may further include date lines extending in the column direction and providing a data signal to the plurality of sub-pixels.

In an embodiment, the plurality of sub-pixels of the active area may include at least one transistor and a light-emitting element connected to the transistor.

In an embodiment, the transistor may include an active pattern disposed on a substrate, a source electrode and a drain electrode respectively connected to the active pattern, and a gate electrode overlapping the active pattern with a gate insulating layer interposed between the gate electrode and the active pattern.

In an embodiment, the display device may further include a first gate line extending in the row direction and providing a first initialization control signal to the sub-pixels.

In an embodiment, the display device may further include a second gate line extending in the row direction and providing a second initialization control signal to the sub-pixels.

A display device in an embodiment includes a substrate including a plurality of sub-pixels arranged in m rows and n columns and including active pixels and dummy pixels, first initialization power lines which provide a first initialization voltage to sub-pixels of the plurality of sub-pixels and extending in a column direction, second initialization power lines which provide a second initialization voltage to sub-pixels of the plurality of sub-pixels and extending in the column direction, and repair lines extending in a row direction. The dummy pixels are disposed in a n column in odd rows among the plurality of sub-pixels, and are disposed in a first column in even rows among the plurality of sub-pixels, and the repair lines are disposed to connect the dummy pixels and the active pixels, respectively, and m and n are natural numbers.

In an embodiment, the first initialization power lines and the second initialization power lines may be alternately disposed.

In an embodiment, the first initialization power lines may be disposed in sub-pixels of even columns among the plurality of sub-pixels.

In an embodiment, the display device may further include date lines extending in the column direction and providing a data signal to the plurality of sub-pixels.

In an embodiment, each of the active pixels may include at least one transistor and a light-emitting element connected to the transistor.

In an embodiment, the transistor may include an active pattern disposed on a substrate, a source electrode and a drain electrode respectively connected to the active pattern, and a gate electrode overlapping the active pattern with a gate insulating layer interposed between the gate electrode and the active pattern.

A display device in an embodiment may include a substrate including sub-pixels arranged in m rows and n columns and including active pixels and dummy pixels, first initialization power lines which provide a first initialization voltage to the sub-pixels and extending in a column direction, second initialization power lines which provide a second initialization voltage to the sub-pixels and extending in the column direction, and repair lines extending in a row direction. The dummy pixels are disposed in a first column in odd rows among the sub-pixels, and are disposed in a n column in even rows among the sub-pixels, and the repair lines are disposed to connect the dummy pixels and the active pixels, respectively, and m and n are natural numbers.

In an embodiment, the first initialization power lines and the second initialization power lines may be alternately disposed.

In an embodiment, the first initialization power lines may be disposed in sub-pixels of even columns among the sub-pixels.

In an embodiment, the display device may further include date lines extending in the column direction and providing a data signal to the sub-pixels.

In an embodiment, each of the active pixels may include at least one transistor and a light-emitting element connected to the transistor, and the transistor may include an active pattern disposed on a substrate, a source electrode and a drain electrode respectively connected to the active pattern, and a gate electrode overlapping the active pattern with a gate insulating layer interposed between the gate electrode and the active pattern.

A display device in an embodiment includes a substrate including an active area and a dummy area, and including a plurality of sub-pixels arranged in m rows and n columns and repair lines extending in a row direction, and sub-pixels of the dummy area may be arranged in an outermost column of the n columns, the repair lines may be arranged so as to connect the sub-pixels of the dummy area and sub-pixels of the active area among the plurality of sub-pixels, respectively, and m and n are natural numbers.

That is, instead of placing the first initialization power line and the second initialization power line in the row direction, the limited wiring space problem may be solved by placing the repair line in the row direction.

Also, it is possible to easily repair the display device by dummy pixels that may occur due to the mismatch between the backplane of the display device and the light-emitting area of the display device as repair pixels. Accordingly, the defective pixel may operate as a normal operating pixel instead of dark ignition, thereby increasing the yield of the display device.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
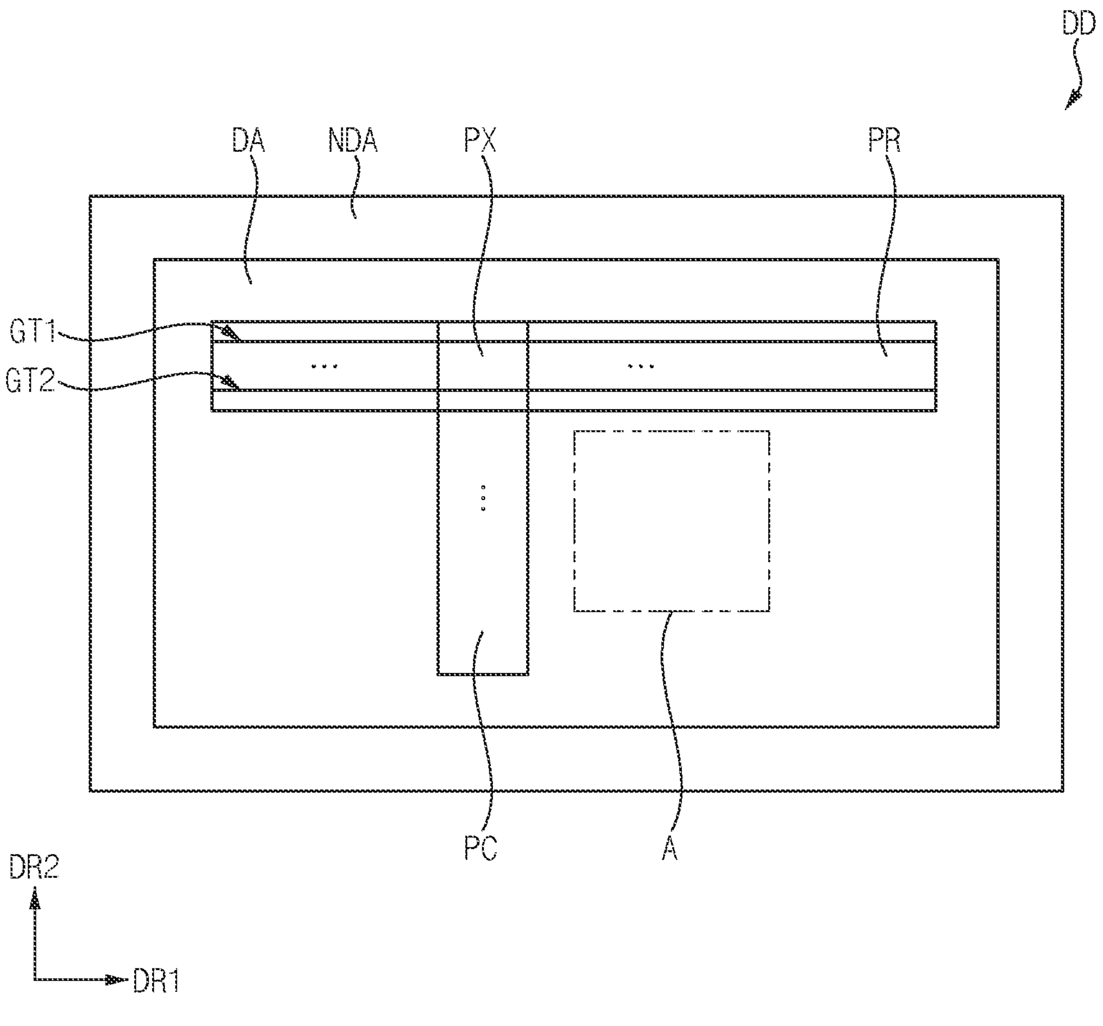
FIG. 1 is a plan view illustrating an embodiment of a display device.

Hereinafter, display devices in embodiments will be described in more detail with reference to the accompanying drawings. The same reference numerals are used for the same components in the drawings, and redundant descriptions of the same components will be omitted.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

The term such as "part" or "unit" as used herein is intended to mean a software component or a hardware component that performs a predetermined function. The hardware component may include a field-programmable gate array ("FPGA") or an application-specific integrated circuit ("ASIC"), for example. The software component may refer to an executable code and/or data used by the executable code in an addressable storage medium. Thus, the software components may be object-oriented software components, class components, and task components, and may include processes, functions, attributes, procedures, subroutines, segments of program code, drivers, firmware, micro codes, circuits, data, a database, data structures, tables, arrays, or variables, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating an embodiment of a display device.

Referring to FIG. 1, a display device DD may include a display area DA and a non-display area NDA. Sub-pixels PX may be disposed in the display area DA, and an image may be displayed in the display area DA of the display device DD.

The sub-pixels PX may be arranged in a first direction DR1 and a second direction DR2 crossing the first direction DR1. That is, the sub-pixels PX may be arranged in a matrix form. Specifically, the sub-pixels PX may be arranged according to sub-pixel rows PR extending in the first direction DR1 and sub-pixel columns PC extending in the second direction DR2. In an embodiment, the first direction DR1 may be a row direction, and the second direction DR2 may be a column direction, for example.

The non-display area NDA may be disposed around the display area DA and may surround at least a portion of the display area DA. In an embodiment, the non-display area NDA may be an area in which an image is not displayed, for example. In an embodiment, the non-display area NDA may correspond to the remaining areas except for the display area DA on the display device DD. The non-display area NDA may include a bending area, a wiring area, a pad area, or the like.

The display device DD may further include a gate driving unit, a data driving unit, a light-emitting driving unit, and the gate driving unit, the data driving unit, and the light-emitting driving unit may be disposed in the non-display area NDA. Optionally, the date driving unit may be disposed (e.g., mounted) on a printed circuit board. The gate driving unit may generate gate signals based on a gate control signal provided from an external device. The gate driving unit may be electrically connected to the sub-pixels PX, and may sequentially output the gate signals to the sub-pixels PX.

The data driving unit may generate a data signal (e.g., a data signal DATA of FIG. 2) based on a data control signal provided from the external device. The data driving unit is electrically connected to the sub-pixels PX, and the data signals may be provided to the sub-pixels PX based on the gate signals.

The light-emitting driving unit may generate a light-emitting driving signal based on a light-emitting driving control signal provided from the external device. The light-emitting driving unit may be electrically connected to the sub-pixels PX, and may provide the light-emitting driving signal to the sub-pixels PX.

The gate lines may extend in the first direction DR1, which is the row direction. The gate lines may include a first gate line GT1 and a second gate line GT2. A first initialization control signal GI (refer to FIGS. 2 and 3) may be provided to the sub-pixels PX through the first gate line GT1. In addition, a second initialization control signal GB (refer to FIGS. 2 and 3) may be provided to the sub-pixels PX through the second gate line GT2.

Figure 2:
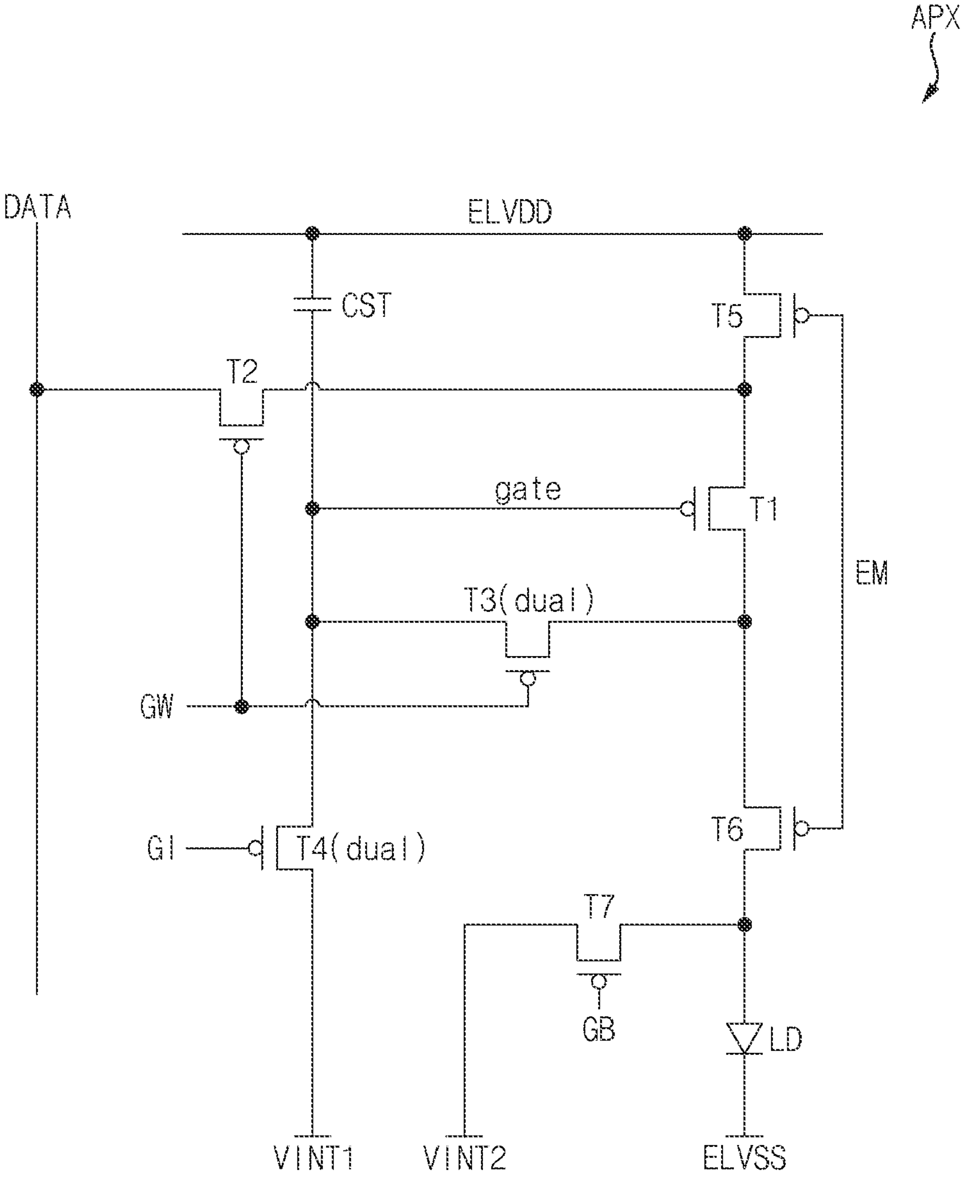
FIGS. 2 and 3 are circuit diagrams illustrating one sub-pixel included in the display device of FIG. 1.
Figure 3:
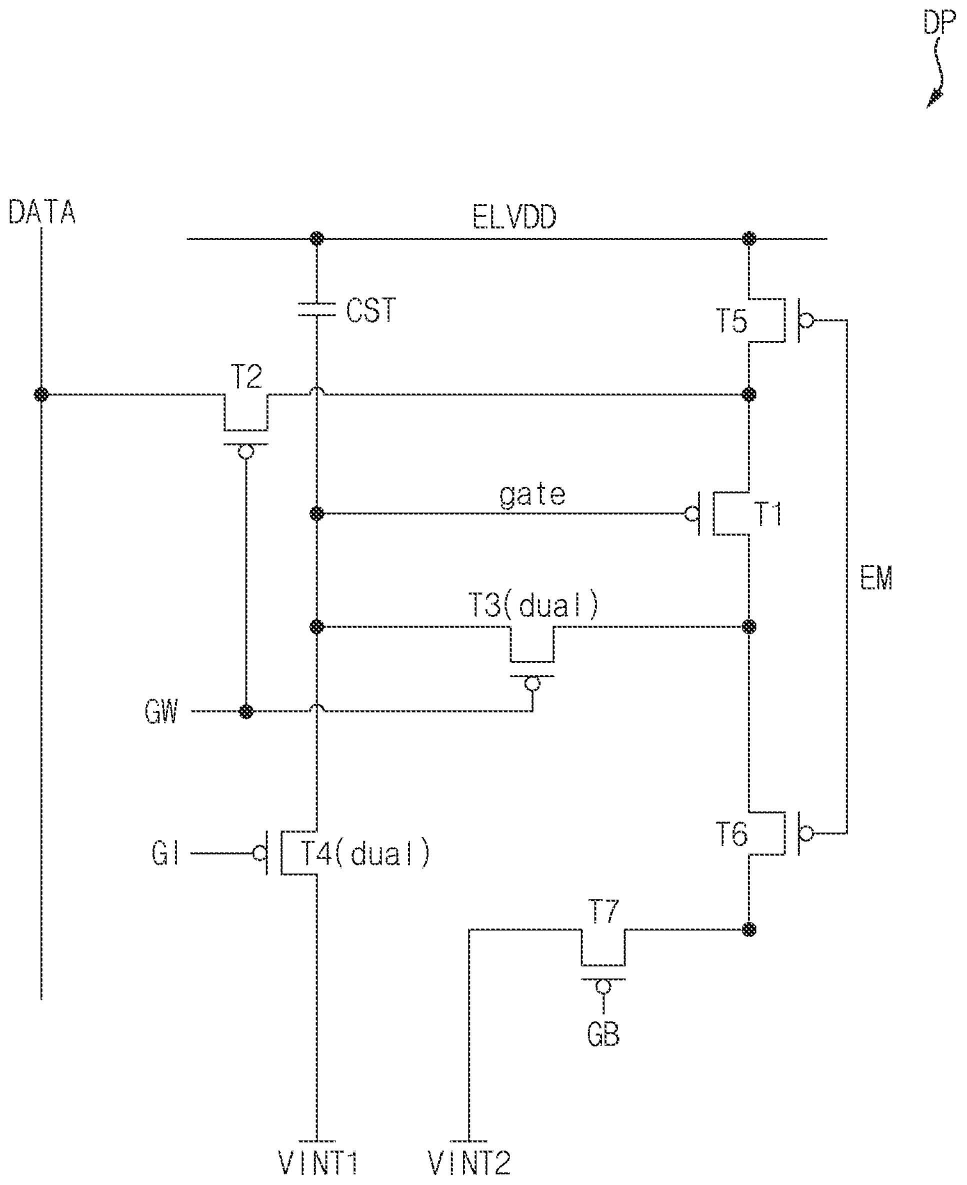

FIGS. 2 and 3 are circuit diagrams illustrating one sub-pixel included in the display device of FIG. 1. Specifically, FIG. 2 is a circuit diagram illustrating one sub-pixel of the active area (or an active pixel) included in the display device of FIG. 1. FIG. 3 is a circuit diagram illustrating one sub-pixel of the dummy area (or an a dummy pixel) included in the display device of FIG. 1.

Referring to FIG. 2, a sub-pixel of the active area APX may include a plurality of transistors T1, T2, T3, T4, T5, T6, T7, a storage capacitor CST, and a light-emitting element LD.

A first transistor T1 may be electrically connected to the high power voltage ELVDD and a first electrode of the light-emitting element LD, and may provide a driving current corresponding to the data signal DATA to the light-emitting element LD. In other words, the first transistor T1 may be a driving transistor.

A second transistor T2 may be connected between a wiring (e.g., the data line DT of FIG. 4) transmitting the data signal DATA and a first electrode of the first transistor T1 and may provide the data signal DATA to the first electrode of the first transistor T1 in response to the gate signal GW. In other words, the second transistor T2 may be a switching transistor.

A third transistor T3 is connected between the gate electrode and a second electrode of the first transistor T1, and may compensate for the threshold voltage of the first transistor T1 by diode-connecting the first transistor T1 in response to the gate signal GW. In other words, the third transistor T3 may be a compensation transistor.

The fourth transistor T4 may be connected between a wiring (e.g., the first initialization power line G1 of FIG. 4) transmitting the first initialization voltage VINT1 and the gate electrode of the first transistor T1. The fourth transistor T4 may provide the first initialization voltage VINT' to the gate electrode of the first transistor T1 in response to the first initialization control signal GI. In other words, the fourth transistor T4 may be a driving initialization transistor.

The fifth transistor T5 may be connected between the wiring of the high power voltage ELVDD and the first electrode of the first transistor T1. The sixth transistor T6 may be connected between the second electrode of the first transistor T1 and the first electrode of the light-emitting element LD. Each of the fifth transistor T5 and the sixth transistor T6 may provide the driving current corresponding to the data signal DATA to the first electrode of the light-emitting element LD in response to the light-emitting driving signal EM. That is, each of the fifth transistor T5 and the sixth transistor T6 may be an emission control transistor.

The seventh transistor T7 is connected between a wiring (e.g., the second initialization power line G2 of FIG. 4) transmitting the second initialization voltage VINT2 and the first electrode of the light-emitting element LD, and may provide the second initialization voltage VINT2 to the first electrode of the light-emitting element LD in response to the second initialization control signal GB. In other words, the seventh transistor T7 may be a diode initialization transistor.

A storage capacitor CST may include a first electrode and a second electrode. The first electrode of the storage capacitor CST may be connected to the first transistor T1, and the second electrode of the storage capacitor CST may receive a high power voltage ELVDD.

Referring to FIGS. 2 and 3, sub-pixels of the dummy area (or dummy pixels (also referred to as dummy areas) DP) to be described later may include a plurality of transistors T1, T2, T3, T4, T5, T6, T7 and a storage capacitor CST. That is, unlike the sub-pixels of the active area APX, the sub-pixels of the dummy area DP may not include the light-emitting element LD. In an embodiment, a low power voltage ELVSS may be applied to a second electrode of the light-emitting element LD.

FIGS. 4 to 7 are enlarged plan views of a region A of FIG. 1.

Referring to FIGS. 1, 2, and 4 to 7, the substrate SUB may include sub-pixels PX arranged in first to m-th rows (where m is an natural number) and first to n-th columns (where n is an natural number). In an embodiment, the sub-pixels PX may include first to fourth sub-pixels PX1, PX2, PX3, PX4, for example.

In an embodiment, the first to fourth sub-pixels PX1, PX2, PX3, PX4 may be repeatedly arranged in the first direction DR1 and the second direction DR2. The sub-pixel row PR of FIG. 1 may be sub-pixels PX of one of the sub-pixels PX of the first to m-th rows of FIG. 4. The sub-pixels PX arranged according to the sub-pixel row PR of FIG. 1 may be sub-pixels PX of one row among the sub-pixels PX of the first to m-th rows of FIG. 4. The sub-pixels PX arranged according to the sub-pixel column PC of FIG. 1 may be sub-pixels PX of one column among the sub-pixels PX of the first to n-th columns of FIG. 4.

Figure 4:
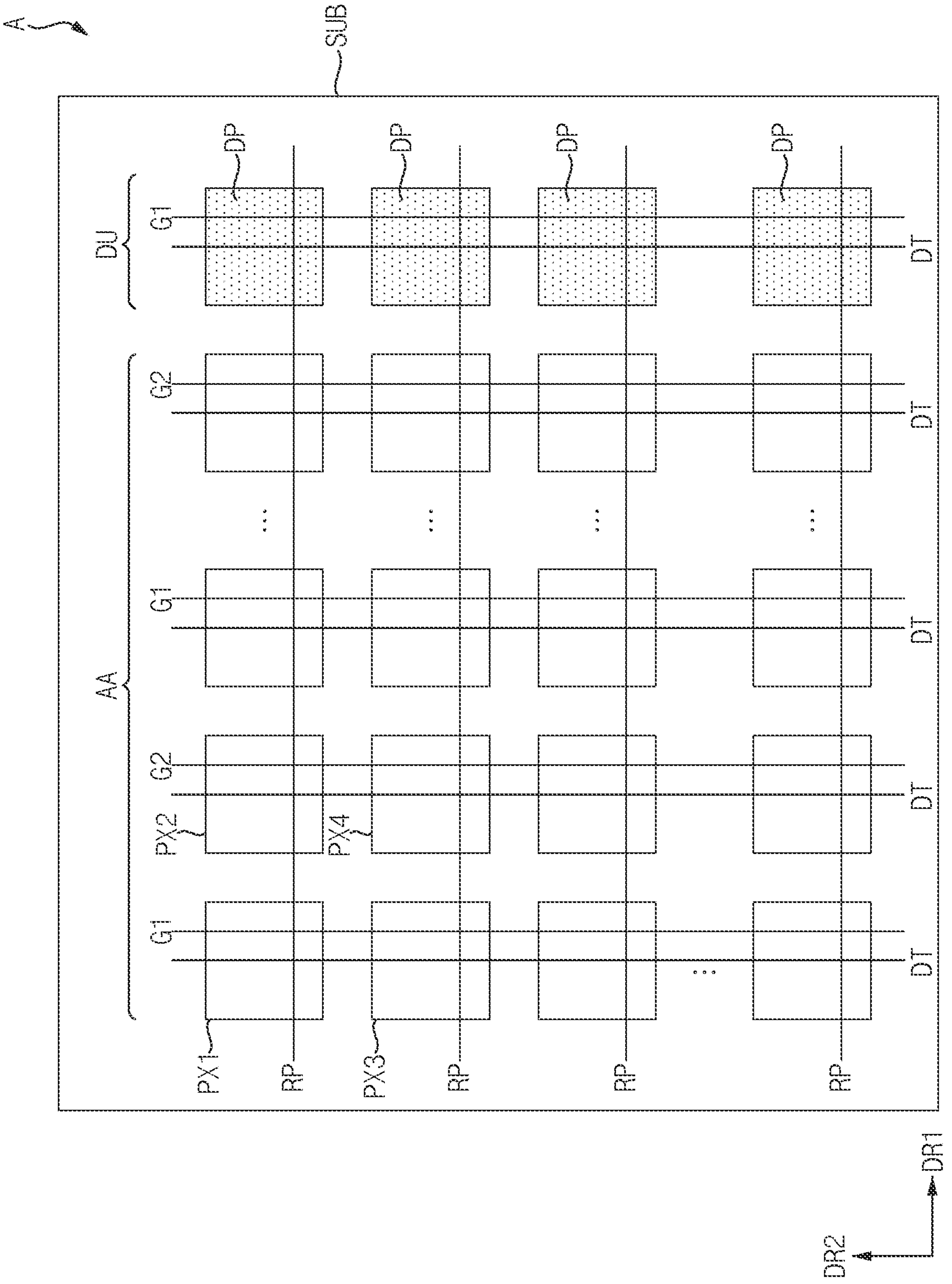
FIGS. 4 to 7 are enlarged plan views of a region A of FIG. 1.

Although the shapes of each of the sub-pixels PX of FIG. 4 are illustrated in a quadrangular (e.g., rectangular) shape, the shapes of each of the sub-pixels PX are not limited thereto. In an embodiment, the shape of each of the sub-pixels PX may have a polygonal shape, for example.

The second sub-pixel PX2 may be disposed in the first direction DR1 from the first sub-pixel PX1. The third sub-pixel PX3 may be disposed in the second direction DR2 from the first sub-pixel PX1, and the fourth sub-pixel PX4 may be disposed in the first direction DR1 from the third sub-pixel PX3.

In an embodiment, among the sub-pixels PX arranged in the first to m rows and the first to n columns, the first sub-pixel PX1 may be disposed in a k-th row (where k is an odd number between 1 and m) and an i-th column (where i is an odd number between 1 and n), and the second sub-pixel PX2 may be disposed in a k-th row and an (i+1)th column, and the third sub-pixel PX3 may be disposed in a (k+1)th row and a i-th column, and the fourth sub-pixel PX4 may be disposed in a (k+1)th row and an (i+1)th column, for example.

That is, the first sub-pixel PX1 may be a sub-pixel disposed in an odd row and an odd column. The second sub-pixel PX2 may be a sub-pixel disposed in an odd row and an even column. The third sub-pixel PX3 may be a sub-pixel disposed in an even row and an odd column. The fourth sub-pixel PX4 may be a sub-pixel disposed in an even row and an even column.

The substrate SUB may include a dummy area DU and an active region AA. Dummy pixels DP may be disposed in the dummy area DU. Active pixels APX may be disposed in the active area AA. As mentioned in FIG. 2, the active pixels APX may include the plurality of transistors T1, T2, T3, T4, T5, T6, T7, T8, the storage capacitor CST, and the light-emitting element LD. Accordingly, the active pixels APX may emit light.

That is, the first sub-pixel PX1, the second sub-pixel PX2, the third sub-pixel PX3, and the fourth sub-pixel PX4 may emit light of a first color, light of a second color, light of a third color, and light of a fourth color, respectively. In an embodiment, the first color may be blue, the second color may be green, the third color may be red, and the fourth color may be green, for example. However, the invention is not limited thereto.

The dummy pixels DP may include the plurality of transistors T1, T2, T3, T4, T5, T6, T7, and the storage capacitor CST as mentioned in FIG. 3. That is, since the dummy pixels DP do not include the light-emitting element LD, the dummy pixels DP may not emit light.

The dummy area DU may be generated because an area in which the substrate SUB of the display device DD is disposed does not match a light-emitting area of the display device DD. Position of the dummy area DU may be determined according to the relative positions of the substrate SUB and the light-emitting area.

Figure 5:
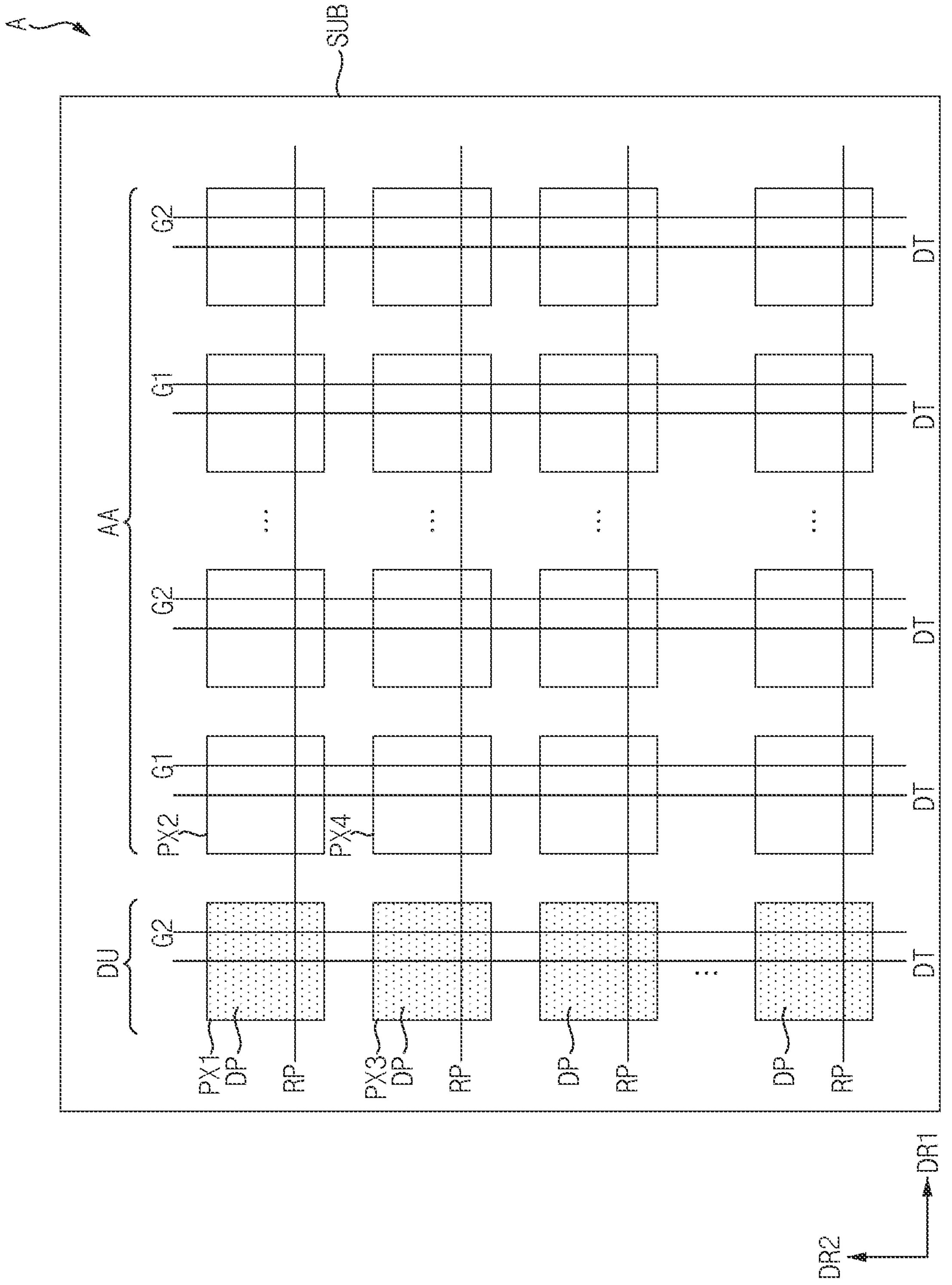

FIG. 4 may illustrate that the dummy pixels DP are arranged in a n-th column of the sub-pixels PX. FIG. 5 may illustrate that the dummy pixels DP are arranged in a first row of the sub-pixels PX.

Figure 6:
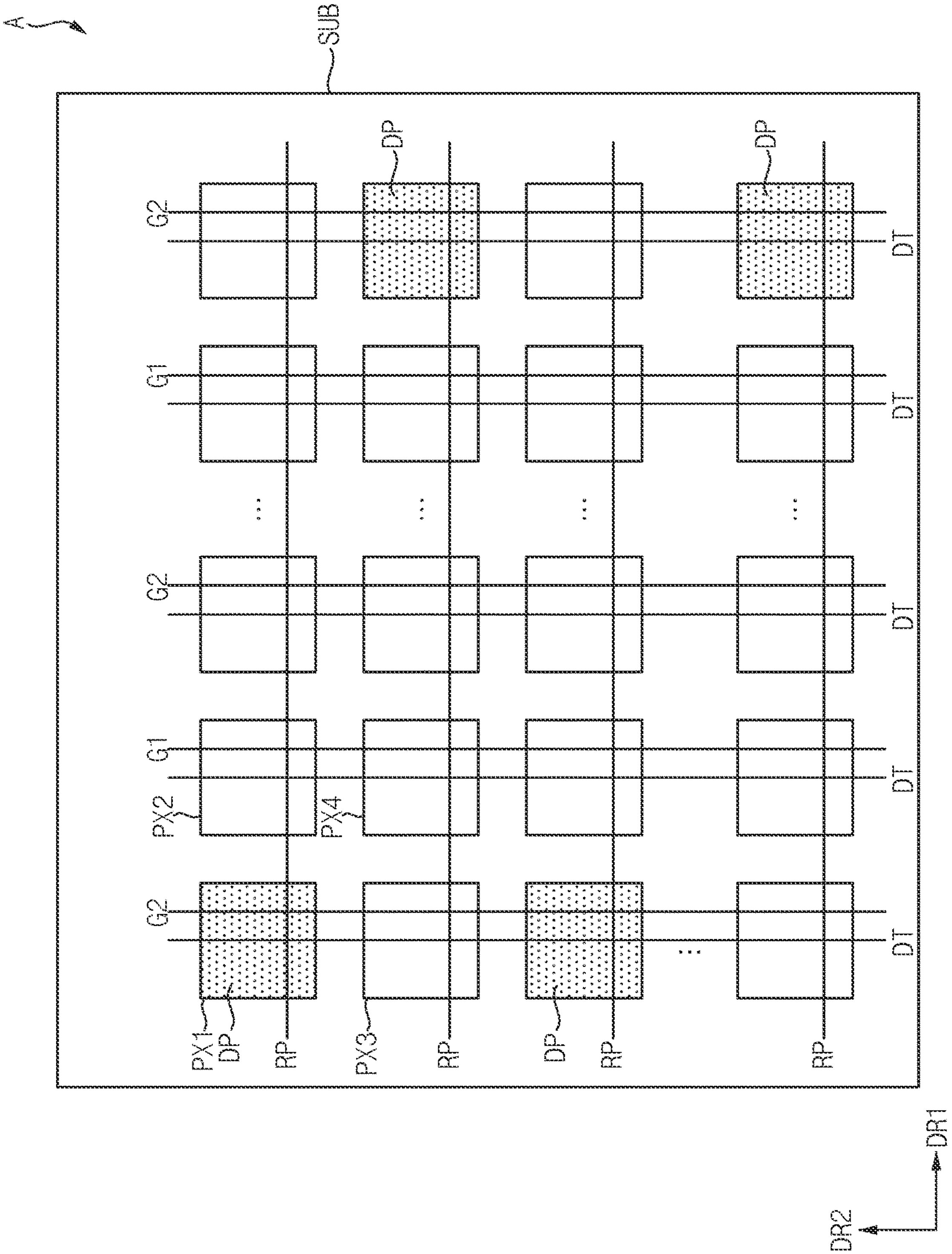

FIG. 6 may indicate that the dummy pixels DP are arranged in a first column in odd rows among sub-pixels PX. That is, the dummy pixels DP may be arranged in an n-th column in even rows among the sub-pixels PX.

Figure 7:
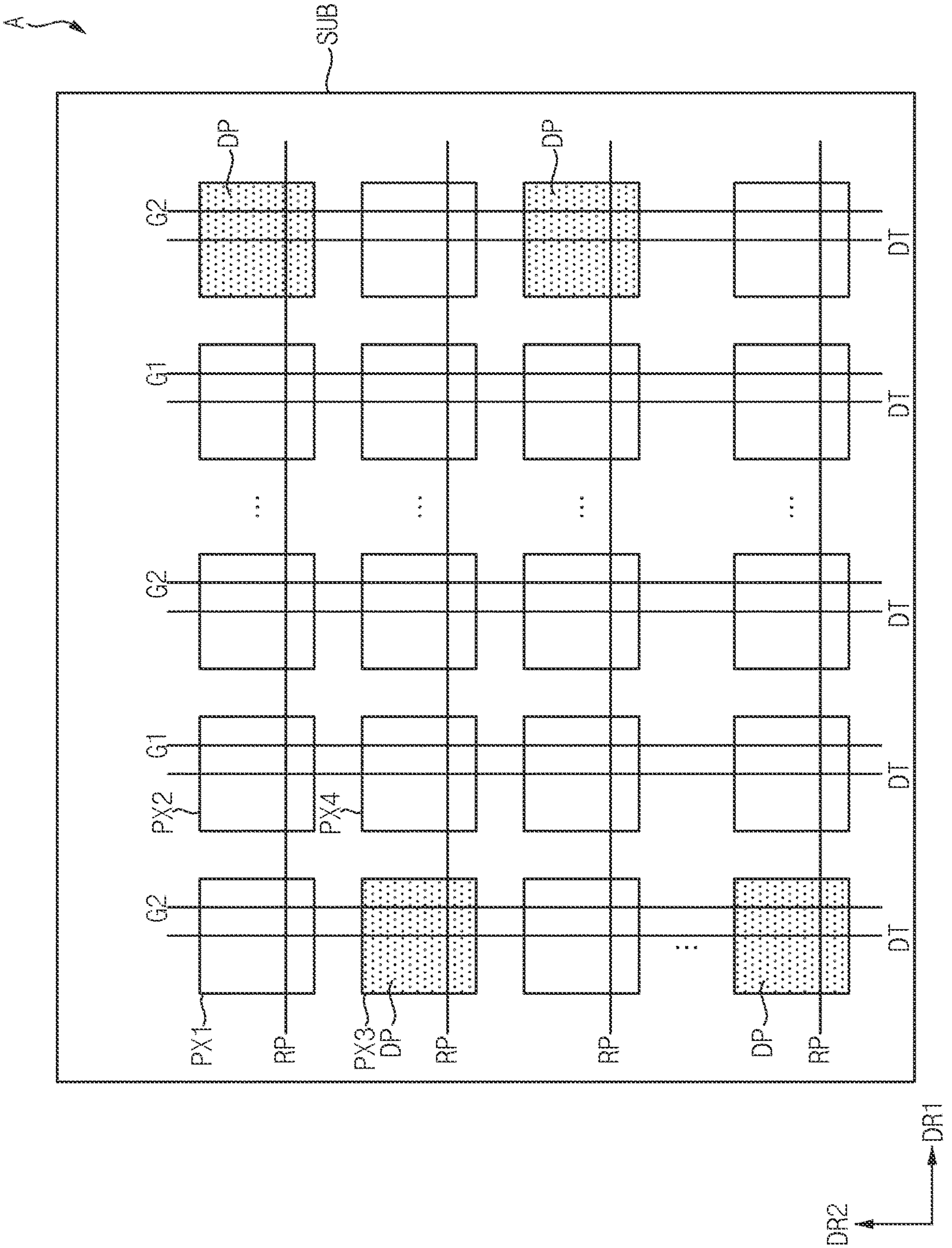

FIG. 7 may indicate that the dummy pixels DP are arranged in an n-th column in odd rows among the sub-pixels PX. That is, the dummy pixels DP may be arranged in a first row in even rows among the sub-pixels PX.

In FIGS. 6 and 7, since the dummy pixels DP are not disposed in a single column, the dummy area DU and the active region AA are not separately displayed, unlike in FIGS. 4 and 5. In addition, in FIGS. 4 to 7, it is assumed that the sub-pixels PX excluding the dummy pixels DP are the active pixels APX.

The data line DT may extend in the second direction DR2. The data signal DATA may be provided to the data line DT. That is, the data signal DATA may be provided to the sub-pixels PX through the data line DT. In an embodiment, the data line DT may be disposed at one side of the first initialization power lines G1 and the second initialization power lines G2 to be described later. However, it is not limited thereto.

The repair line RP may extend in the first direction DR1. The defective pixel among the active pixels APX may be electrically connected to the corresponding dummy pixel DP among the dummy pixels DP through the repair line RP. In an embodiment, in FIG. 4, assuming that the first sub-pixel PX1 is a defective pixel, the first sub-pixel PX1 may be electrically connected to the dummy pixel DP disposed in a first row and a n-th column among the sub-pixels PX through the repair line RP, for example. Also, in FIG. 6, assuming that the second sub-pixel PX2 is a defective pixel, the second sub-pixel PX2 may be electrically connected to the dummy pixel DP disposed in a first row and a first column among the sub-pixels PX through the repair line RP.

In this case, the term "could be connected" may mean a state that may be connected using a laser or the like in a repair process. That is, when a defective pixel occurs, the defective pixel and the dummy pixel DP may be electrically connected through a repair line RP. The term "corresponding" may also mean that the defective pixel and the dummy pixel DP are disposed in the same column.

When the defective pixel occurs, the data signal DATA provided to the defective pixel may be applied to the dummy pixel DP corresponding to the defective pixel. The corresponding dummy pixel DP may generate a driving current corresponding to the applied data signal DATA.

The driving current may be provided to the defective pixel through a repair line RP. The defective pixel may include a light-emitting element electrically separated from the pixel circuit. The driving current provided from the dummy pixel DP may be provided to the light-emitting element.

Accordingly, the light-emitting element may emit light with a brightness corresponding to the data signal DATA provided to the defective pixel and the corresponding dummy pixel DP. Since the defective pixel may normally emit light through the dummy pixel DP, the dummy pixel DP may be also referred to as a repair pixel.

The first initialization power lines G1 and the second initialization power lines G2 may extend in the second direction DR2. The first initialization power lines G1 and the second initialization power lines G2 may be alternately disposed. FIG. 4 may indicate that the first initialization power lines G1 are disposed in sub-pixels PX of odd rows among the sub-pixels PX. That is, the second initialization power lines G2 may be disposed in sub-pixels PX of even rows among the sub-pixels PX.

FIGS. 5 to 7 may indicate that first initialization power lines G1 are disposed in sub-pixels PX of even rows among the sub-pixels PX. That is, the second initialization power lines G2 may be disposed in sub-pixels PX of odd rows among the sub-pixels PX.

The first initialization voltage VINT1 may be provided to the first initialization power lines G1. In addition, the second initialization voltage VINT2 may be provided to the second initialization power lines G2. That is, the first initialization voltage VINT1 may be provided to the sub-pixels PX through the first initialization power lines G1. In addition, the second initialization voltage VINT2 may be provided to the sub-pixels PX through the second initialization power lines G2.

The first initialization voltage VINT1 may be a voltage for initializing the first transistor T1. Specifically, while the fourth transistor T4 is turned on to the first initialization control signal GI, the first initialization voltage VINT1 may be provided to a gate terminal of the first transistor T1. Accordingly, the fourth transistor T4 may initialize the gate terminal of the first transistor T1 to the first initialization voltage VINT1.

The second initialization voltage VINT2 may be a voltage for initializing the light-emitting element LD of the active pixel APX. Specifically, the gate terminal of the seventh transistor T7 may receive a second initialization control signal GB. The first terminal of the seventh transistor T7 may receive a second initialization voltage VINT2. The second terminal of the seventh transistor T7 may be connected to the first terminal of the light-emitting element LD.

When the seventh transistor T7 is turned on in response to the second initialization control signal GB, the seventh transistor T7 may provide the second initialization voltage VINT2 to the light-emitting element LD. Accordingly, the seventh transistor T7 may initialize the first terminal of the light-emitting element LD to the second initialization voltage VINT2.

A repair line RP may be desired in the repair process of connecting the defective pixel and the dummy pixels DP corresponding to the defective pixel. However, in the existing invention, the first initialization power lines G1 and/or the second initialization power lines G2 may extend in the first direction DR1, and thus a space in which the repair line RP may be disposed may be limited. In the invention, the first initialization power lines G1 and the second initialization power lines G2 are disposed to extend in the second direction DR2, thereby ensuring a space in which the repair lines RP may be disposed.

In addition, it is possible to easily repair the display device DD by dummy pixels that may be caused by mismatch between the backplane of the display device DD and the light-emitting area of the display device DD as repair pixels. Accordingly, the defective pixel may operate as a normal operating pixel instead of dark ignition, thereby increasing the yield of the display device.

Figure 8:
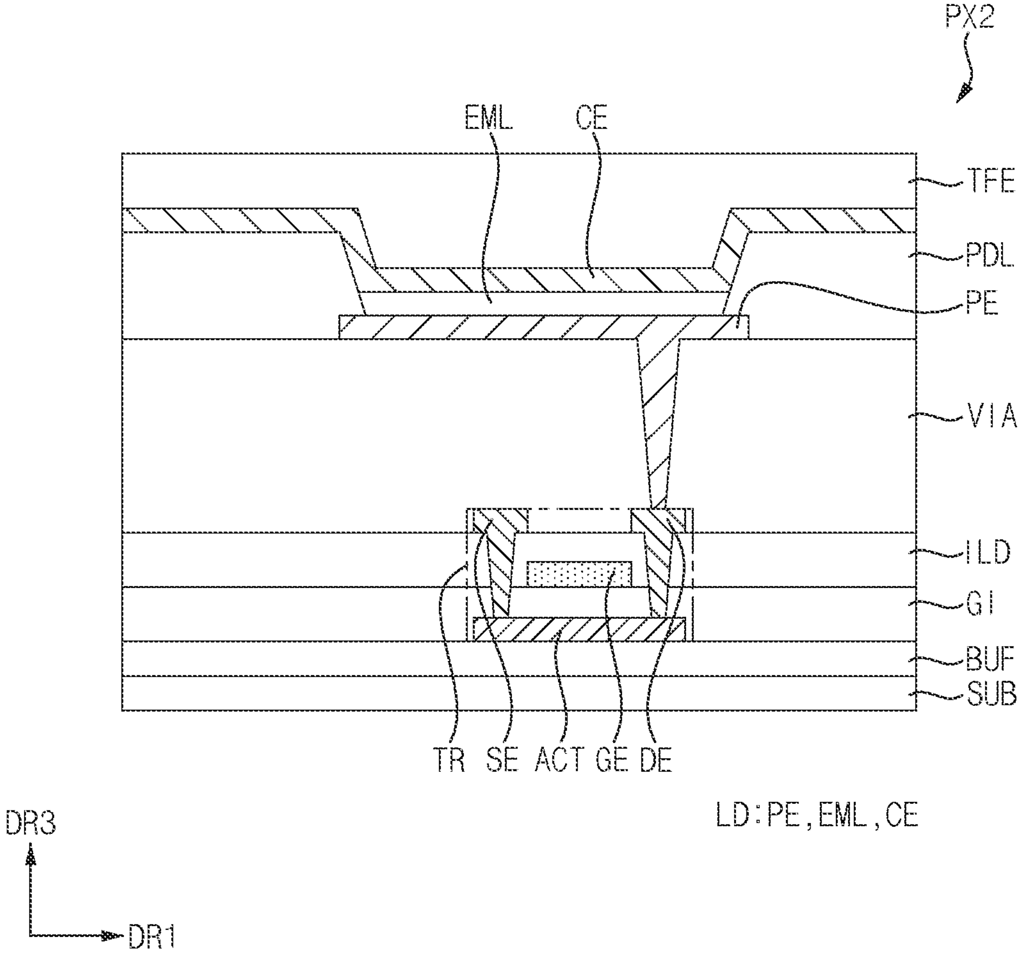
FIG. 8 is a cross-sectional view illustrating a second pixel of FIG. 4.

FIG. 8 is a cross-sectional view illustrating a second pixel of FIG. 4

Referring to FIGS. 2, 4, and 8, the second pixel PX2 may include a transistor TR and a light emitting element LD. The transistor TR of FIG. 8 may refer to one of the plurality of transistors T1, T2, T3, T4, T5, T6, T7, and T8 of FIG. 2.

FIG. 8 may represent the second pixel PX2, but the present disclosure is not limited thereto. That is, FIG. 8 may indicate a sub-pixel APX of an arbitrary active area AA.

The second sub-pixel PX2 may include a substrate SUB, a buffer layer BUF, a gate insulating layer GI, an interlayer insulating layer ILD, a via insulating layer VIA, an active layer ACT, a source electrode SE, a gate electrode GE, a drain electrode DE, a pixel electrode PE, a pixel defining layer PDL, a light emitting layer EML, a common electrode CE, and an encapsulating layer TFE.

The transistor TR may include the active layer ACT, the source electrode SE, the gate electrode GE, and the drain electrode DE.

A substrate SUB may include a transparent material or an opaque material. The substrate SUB may be formed of a transparent resin substrate. Example of the transparent resin substrate may include a polyimide substrate. In this case, the polyimide substrate may include a first organic layer, a first barrier layer, a second organic layer, or the like.

Alternatively, the substrate SUB may include a quartz substrate, a synthetic quartz substrate, a calcium fluoride substrate, a fluorine-doped quartz substrate, a sodalime substrate, a non-alkali glass substrate, or the like. These materials may be used alone or in combination with each other.

A buffer layer BUF may be disposed on the substrate SUB. The buffer layer BUF may prevent metal atoms or impurities from diffusing from the substrate SUB to the transistor TR. In addition, the buffer layer BUF can improve the flatness of a surface of the substrate SUB when the surface of the substrate SUB is not uniform.

For example, the buffer layer BUF may include an inorganic material such as silicon oxide, silicon nitride, silicon oxynitride, or the like. These materials may be used alone or in combination with each other.

An active layer ACT may be disposed on the buffer layer BUF. The active layer ACT may include a metal oxide semiconductor, an inorganic semiconductor (e.g., amorphous silicon, polysilicon), an organic semiconductor, or the like. These materials may be used alone or in combination with each other. The active layer ACT may include a source area, a drain area, and a channel area disposed between the source area and the drain area.

The metal oxide semiconductor may include a binary compound ("$AB_x$"), a ternary compound ("$AB_xC_y$"), a tetragonal compound ("$AB_xC_yD_z$"), or the like including indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like.

For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), and indium gallium zinc oxide ("IGZO"). These materials may be used alone or in combination with each other.

A gate insulating layer GI may be disposed on the buffer layer BUF. The gate insulating layer GI may sufficiently cover the active layer ACT, and may have a substantially flat upper surface without generating a step around the active layer ACT. Alternatively, the gate insulating layer GI may cover the active layer ACT and may be disposed along a profile of the active layer ACT.

For example, the gate insulating layer GI may include inorganic materials such as silicon oxide ("$SiO_x$"), silicon nitride ("$SiN_x$"), silicon carbide ("$SiC_x$"), silicon oxynitride ("$SiO_xN_y$"), silicon oxycarbide ("$SiO_xC_y$"), or the like. These materials may be used alone or in combination with each other.

A gate electrode GE may be disposed on the gate insulating layer GI. The gate electrode GE may overlap the channel area of the active layer ACT.

The gate electrode GE may include a metal, an alloy metal nitride, a conductive metal oxide, a transparent conductive material, or the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), or the like. Examples of the conductive metal oxide may include Indium tin oxide, indium zinc oxide, or the like. In addition, examples of the metal nitride may include aluminum nitride ("$AlN_x$"), tungsten nitride ("$WN_x$"), chromium nitride ("$CrN_x$"), or the like. Each of these materials may be used alone or in combination with each other.

An interlayer insulating layer ILD may be disposed on the gate insulating layer GI. The interlayer insulating layer ILD may sufficiently cover the gate electrode GE, and may have a substantially flat upper surface without generating a step around the gate electrode GE. Alternatively, the interlayer insulating layer ILD may cover the gate electrode GE, and may be disposed along a profile of the gate electrode GE.

For example, the interlayer insulating layer ILD may include inorganic materials such as silicon oxide, silicon nitride, silicon carbide, silicon oxynitride, silicon oxycarbide, or the like. These materials may be used alone or in combination with each other.

A source electrode SE may be disposed on the interlayer insulating layer ILD. The source electrode SE may be connected to the source area of the active layer ACT through a contact hole penetrating the gate insulating layer GI and the interlayer insulating layer ILD.

A drain electrode DE may be disposed on the interlayer insulating layer ILD. The drain electrode DE may be connected to the drain area of the active layer ACT through a contact hole penetrating the gate insulating layer GI and the interlayer insulating layer ILD.

For example, the source electrode SE may include a metal, an alloy, a metal nitride, a conductive metal oxide, a transparent conductive material, or the like. These materials may be used alone or in combination with each other. The drain electrode DE may be formed through the same process as the source electrode SE and may include the same material as the source electrode SE.

A via insulating layer VIA may be disposed on the interlayer insulating layer ILD. The via insulating layer VIA may sufficiently cover the source electrode SE and the drain electrode DE. The via insulating layer VIA may include an organic material. For example, the via insulating layer VIA may include organic materials such as phenolic resin, acrylic resin, polyimide resin, polyamide resin, siloxane resin, epoxy resin, or the like. These materials may be used alone or in combination with each other.

A pixel electrode PE may be disposed on the via insulating layer VIA. The pixel electrode PE may be connected to the drain electrode DE through a contact hole penetrating the via insulating layer VIA.

The pixel electrode PE may include a metal, an alloy, a metal nitride, a conductive metal oxide, a transparent conductive material, or the like. These materials be used alone or in combination with each other. In an embodiment, the pixel electrode PE may have a stacked structure including ITO/Ag/ITO. For example, the pixel electrode PE may operate as an anode.

A pixel defining layer PDL may be disposed on the via insulating layer VIA. The pixel defining layer PDL may cover both side portions of the pixel electrode PE. In addition, an opening exposing a portion of the upper surface of the pixel electrode PE may be defined in the pixel defining layer PDL.

For example, the pixel defining layer PDL may include an inorganic material or an organic material. In an embodiment, the pixel defining layer PDL may include an organic material such as an epoxy resin, a siloxane resin, or the like. These materials may be used alone or in combination with each other. In another embodiment, the pixel defining layer PDL may further include a light blocking material containing a black pigment, a black dye, or the like.

A light emitting layer EML may be disposed on the pixel electrode PE. The light emitting layer EML may include an organic material that emits light of a predetermined color. For example, the light emitting layer EML may include an organic material that emits red light. However, the present disclosure is not limited thereto, and the light emitting layer EML may emit light of a different color from red light.

A common electrode CE may be disposed on the light emitting layer EML and the pixel defining layer PDL. The common electrode CE may include a metal, an alloy, a metal nitride, a conductive metal oxide, a transparent conductive material, or the like. These materials may be used alone or in combination with each other. The common electrode CE may operate as a cathode.

A light emitting element LD may include the pixel electrode PE, the light emitting layer EML, and the common electrode CE.

An encapsulation layer TFE may be disposed on the common electrode CE. The encapsulation layer TFE may prevent impurities and moisture from penetrating into the pixel electrode PE, the light emitting layer EML, and the common electrode CE from the outside. The encapsulation layer TFE may include at least one inorganic layer and at least one organic layer.

For example, the inorganic layer may include silicon oxide, silicon nitride, silicon oxynitride, or the like. These materials may be used alone or in combination with each other. The organic layer may include a polymer cured product such as polyacrylate.

Although an exemplary embodiment of the second sub-pixel PX2 has been described with reference to FIG. 8, the second sub-pixel PX2 is not limited to the structure shown in FIG. 8. That is, the second sub-pixel PX2 may include all structures that receive an electrical signal and emit light having a luminance corresponding to the intensity of the electrical signal.

The disclosure may be applied to various display devices. In an embodiment, the disclosure is applicable to various display devices such as display devices for vehicles, ships and aircraft, portable communication devices, display devices for exhibition or information transmission, medical display devices, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept.

Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A display device comprising:
a substrate including an active area and a dummy area, and including a plurality of sub-pixels arranged in m rows and n columns;
first initialization power lines which provide a first initialization voltage to sub-pixels of the plurality of sub-pixels and extending in a column direction;
second initialization power lines which provide a second initialization voltage different from the first initialization voltage to sub-pixels of the plurality of sub-pixels and extending in the column direction; and
repair lines extending in a row direction,
wherein sub-pixels of the dummy area among the plurality of sub-pixels are arranged in an outermost column of the n columns, the repair lines connect the sub-pixels of the dummy area and sub-pixels of the active area among the plurality of sub-pixels, respectively,
m and n are natural numbers, and
among the n columns, a first column includes sub-pixels, among the plurality of sub-pixels, overlapping only one of a first initialization power line, among the first initialization power lines, and a second initialization power line immediately next to the first initialization power line, among the second initialization power lines, and a second column immediately next to the first column includes sub-pixels, among the plurality of sub-pixels, overlapping only a remaining one of the first initialization power line and the second initialization power line.

2. The display device of claim 1, wherein the sub-pixels of the dummy area are arranged in n column.

3. The display device of claim 1, wherein the first initialization power lines are disposed in sub-pixels of even columns among the plurality of sub-pixels.

4. The display device of claim 1, further comprising data lines extending in the column direction and providing a data signal to the plurality of sub-pixels.

5. The display device of claim 1, wherein the plurality of sub-pixels of the active area includes a transistor and a light-emitting element connected to the transistor.

6. The display device of claim 5, wherein the transistor comprises:
an active pattern disposed on a substrate;
a source electrode and a drain electrode respectively connected to the active pattern; and
a gate electrode overlapping the active pattern with a gate insulating layer interposed between the gate electrode and the active pattern.

7. The display device of claim 1, further comprising a first gate line extending in the row direction and providing a first initialization control signal to the sub-pixels.

8. The display device of claim 7, further comprising a second gate line extending in the row direction and providing a second initialization control signal to the sub-pixels.

9. A display device comprising:
a substrate including a plurality of sub-pixels arranged in m rows and n columns and including active pixels and dummy pixels;
first initialization power lines which provide a first initialization voltage to sub-pixels of the plurality of sub-pixels and extending in a column direction;
second initialization power lines which provide a second initialization voltage different from the first initialization voltage to sub-pixels of the plurality of sub-pixels and extending in the column direction; and
repair lines extending in a row direction,
wherein the dummy pixels are disposed in a n column in odd rows among the plurality of sub-pixels, and are disposed in a first column in even rows among the plurality of sub-pixels,
the repair lines connect the dummy pixels and the active pixels, respectively,
m and n are natural numbers, and
among the n columns, a first column includes sub-pixels, among the plurality of sub-pixels, overlapping only one of a first initialization power line, among the first initialization power lines, and a second initialization power line immediately next to the first initialization power line, among the second initialization power lines, and a second column immediately next to the first column includes sub-pixels, among the plurality of sub-pixels, overlapping only a remaining one of the first initialization power line and the second initialization power line.

10. The display device of claim 9, wherein the first initialization power lines are disposed in sub-pixels of even columns among the plurality of sub-pixels.

11. The display device of claim 9, further comprising data lines extending in the column direction and providing a data signal to the plurality of sub-pixels.

12. The display device of claim 9, wherein each of the active pixels includes a transistor and a light-emitting element connected to the transistor.

13. The display device of claim 12, wherein the transistor comprises:
an active pattern disposed on a substrate;
a source electrode and a drain electrode respectively connected to the active pattern; and
a gate electrode overlapping the active pattern with a gate insulating layer interposed between the gate electrode and the active pattern.

14. A display device comprising:
a substrate including a plurality of sub-pixels arranged in m rows and n columns and including active pixels and dummy pixels;
first initialization power lines which provide a first initialization voltage to sub-pixels of the plurality of sub-pixels and extending in a column direction;
second initialization power lines which provide a second initialization voltage different from the first initialization voltage to sub-pixels of the plurality of sub-pixels and extending in the column direction; and
repair lines extending in a row direction,
wherein the dummy pixels are disposed in a first column in odd rows among the plurality of sub-pixels, and are disposed in a n column in even rows among the plurality of sub-pixels,
the repair lines connect the dummy pixels and the active pixels, respectively,
m and n are natural numbers, and
among the n columns, a first column includes sub-pixels, among the plurality of sub-pixels, overlapping only one of a first initialization power line, among the first initialization power lines, and a second initialization power line immediately next to the first initialization power line, among the second initialization power lines, and a second column immediately next to the first column includes sub-pixels, among the plurality of sub-pixels, overlapping only a remaining one of the first initialization power line and the second initialization power line.

15. The display device of claim 14, wherein the first initialization power lines are disposed in sub-pixels of even columns among the plurality of sub-pixels.

16. The display device of claim 14, further comprising data lines extending in the column direction and providing a data signal to the plurality of sub-pixels.

17. The display device of claim 14, wherein each of the active pixels includes a transistor and a light-emitting element connected to the transistor, and the transistor comprises:

an active pattern disposed on a substrate;

source and drain electrodes on the active pattern; and a gate electrode overlapping the active pattern with a gate insulating layer interposed between the gate electrode overlapping the active pattern.

* * * * *